US009691828B2

(12) United States Patent
Jiao et al.

(10) Patent No.: US 9,691,828 B2
(45) Date of Patent: Jun. 27, 2017

(54) DISPLAY APPARATUS HAVING THIN FILMS INCLUDING NANOPARTICLES

(71) Applicant: BOE TECHNOLOGY GROUP CO., LTD., Beijing (CN)

(72) Inventors: Zhiqiang Jiao, Beijing (CN); Shibo Jiao, Beijing (CN); Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,069

(22) PCT Filed: Jul. 14, 2014

(86) PCT No.: PCT/CN2014/082117
§ 371 (c)(1),
(2) Date: Apr. 15, 2015

(87) PCT Pub. No.: WO2015/158049
PCT Pub. Date: Oct. 22, 2015

(65) Prior Publication Data
US 2017/0033163 A1 Feb. 2, 2017

(30) Foreign Application Priority Data
Apr. 15, 2014 (CN) .......................... 2014 1 0150972

(51) Int. Cl.
*H01L 29/08* (2006.01)
*H01L 27/32* (2006.01)
(Continued)

(52) U.S. Cl.
CPC ........ *H01L 27/322* (2013.01); *H01L 27/3218* (2013.01); *H01L 51/5268* (2013.01); *H01L 51/56* (2013.01)

(58) Field of Classification Search
CPC ............... H01L 27/322; H01L 27/3218; H01L 51/5268; H01L 51/56
See application file for complete search history.

(56) References Cited

U.S. PATENT DOCUMENTS 5,909,081 A 6/1999 Eida et al.
5,920,080 A 7/1999 Jones
(Continued)

FOREIGN PATENT DOCUMENTS

CN 1786753 6/2006
CN 101764149 6/2010
(Continued)

OTHER PUBLICATIONS

International Search Report and Written Opinion of the ISA in PCT/CN2014/082117 mailed Jan. 25, 2015, and English Translation. 19 pages.
(Continued)

*Primary Examiner* — Matthew Gordon
(74) *Attorney, Agent, or Firm* — Blakely Sokoloff Taylor & Zafman LLP

(57) ABSTRACT

The invention provides a display apparatus and a method for manufacturing the same, relates to the field of display technology, and solves the problem of low display luminance due to the existing display apparatus being affected by other film layers. A display apparatus comprises a light emitting unit and further comprises several layers of thin film located in the light emission path of the light emitting unit, and at least one of the several layers of thin film has nanoparticles.

13 Claims, 2 Drawing Sheets

(51) Int. Cl.
*H01L 51/52* (2006.01)
*H01L 51/56* (2006.01)

(56) References Cited

U.S. PATENT DOCUMENTS

| | | |
|---|---|---|
| 6,515,428 B1 | 2/2003 | Yeh et al. |
| 2004/0061107 A1 | 4/2004 | Duggal |
| 2010/0150513 A1* | 6/2010 | Zhang .................... B82Y 20/00 385/131 |
| 2011/0171789 A1* | 7/2011 | Korgel .............. H01L 29/42332 438/151 |
| 2013/0001602 A1 | 1/2013 | Park et al. |

FOREIGN PATENT DOCUMENTS

| | | |
|---|---|---|
| CN | 101620290 | 3/2012 |
| CN | 102738403 | 10/2012 |
| CN | 103000639 A | 3/2013 |
| CN | 103000660 A | 3/2013 |
| CN | 103022081 A | 4/2013 |
| CN | 103441138 | 12/2013 |
| CN | 203414701 | 1/2014 |
| CN | 203466191 | 3/2014 |
| CN | 203883008 | 10/2014 |

OTHER PUBLICATIONS

Office Action in Chinese Application No. 201410150972.9 dated Aug. 23, 2016, with English translation. 7 pages.
Chinese Office Action with English Language Translation, dated Feb. 1, 2016, Chinese Application No. 201410150972.9.
Decision on Rejection with English Language Translation, dated Dec. 30, 2016, Chinese Application No. 201410150972.9.

* cited by examiner

DISPLAY APPARATUS HAVING THIN FILMS INCLUDING NANOPARTICLES

FIELD OF THE INVENTION

The invention relates to the field of display technology, and in particular, to a display apparatus and a method for manufacturing the same.

BACKGROUND OF THE INVENTION

An organic light emitting diode (OLED) is an organic thin film electroluminescent device, which has the advantages of a simple manufacturing process, a low cost, a high luminous efficiency and being easy to form a flexible structure, etc. Therefore, a display technique utilizing an organic light emitting diode has become an important display technique.

The techniques for a white organic light emitting diode are relative mature, the luminous efficiency is high, and therefore they are widely applied in organic light emitting diode display apparatuses. A white organic light emitting diode display apparatus comprises an array substrate 100 and an encapsulating substrate 200. As shown in FIG. 1, the array substrate 100 comprises a first underlay substrate 10, and a black matrix film layer 11, a color film layer 12, a flat layer 13, a first electrode layer 14, a second electrode layer 17, and an organic light emitting functional layer 15 and a pixel defining layer 16 located between the first electrode 14 and the second electrode 17, which are formed on the first underlay substrate 10. When electric signals are loaded to the first electrode 14 and the second electrode 17 simultaneously, a current passes the organic light emitting functional layer 15 to excite the functional layer to emit light so as to implement display.

Therein, the light emitting functional layer comprises a plurality of light emitting units, the color film layer comprises color film units of three colors, red, green, and blue, and each light emitting unit corresponds to a color film unit of one of the colors, to implement color display. However, for the organic light emitting display implemented by the method, since the emergence of light needs to pass the flat layer 13, the color film layer 12 and the underlay substrate 11, and total reflection will happen to part of the light, there is a certain loss for the light, which will affect directly the display luminance of the display device.

SUMMARY OF THE INVENTION

Embodiments of the invention provides a display apparatus and a method for manufacturing the same, which solve the problem of low display luminance due to the existing display apparatus being affected by other film layers.

To achieve the above objective, an embodiment of the invention employs the following technical solution.

An embodiment of the invention provides a display apparatus comprising a light emitting unit and further comprising several layers of thin film located in the light emission path of the light emitting unit, at least one of the several layers of thin film having nanoparticles.

At least one of the several layers of thin film is a thin film having nanoparticles, and therefore, the light emanated from the light emitting unit passes the nanoparticles and is scattered, which reduces the total reflection of the light, increases the output of the light, and in turn improves the light emission efficiency of the entire display apparatus, and increases the display luminance.

Optionally, the at least one layer of thin film having nanoparticles comprises a color film layer.

Optionally, the at least one layer of thin film having nanoparticles further comprises a passivation layer and/or a flat layer.

Optionally, the nanoparticle is one kind or several kinds of inorganic nanoparticle.

Optionally, the inorganic nanoparticle is produced by one or more material selected from the group of: $MgF_2$, $CaF_2$, $SiO_2$, $BaF$, $B_2O_3$, $NaF$, $AlF_3$, $SiO$, $LiF$, $Na_3AlF_6$, $KF$, $CdF_2$, $DyF_3$, $LaF_3$, $WO_3$, $ZnSe$, $ZnS$, $TiO_2$, $Sb_2S_3$, $ZrO_2$, $BaO$, $BaS$, $BaTiO_3$, $Bi_2O_3$, $V_2O_5$, and $SiN_x$.

Optionally, only the color film layer has nanoparticles, and the thickness of the color film layer is 1.5-4 μm.

Optionally, the color film layer comprises a red film layer, a green film layer and a blue film layer, wherein only the blue film layer has nanoparticles.

Optionally, the red film layer, the green film layer and the blue film layer all have nanoparticles.

Optionally, the volume concentration of the nanoparticles in the color film layer is 1%-60%.

Optionally, the volume concentration of the nanoparticles in the color film layer is 5%-30%.

Optionally, the grain diameter of the nanoparticle is 1.5-5 nm.

Optionally, the light emitting unit is a backlight unit or an organic light emitting diode light emitting unit.

An embodiment of the invention provides a method for manufacturing a display apparatus, which display apparatus comprises a light emitting unit, the method comprising: forming several layers of thin film located in the light emission path of the light emitting unit, at least one of the several layers of thin film having nanoparticles.

Optionally, the at least one layer of thin film having nanoparticles comprises a color film layer; and the method further comprises: forming a color film layer doped with nanoparticles on an underlay substrate.

Optionally, the step of forming a color film layer doped with nanoparticles on an underlay substrate comprises:

forming a blue film layer doped with nanoparticles on the underlay substrate; and forming a red film layer and a green film layer which are not doped with nanoparticles on the underlay substrate.

Optionally, the step of forming a color film layer doped with nanoparticles on an underlay substrate comprises:

forming a red film layer, a green film layer and a blue film layer which are doped with nanoparticles on the underlay substrate.

Optionally, the at least one layer of thin film having nanoparticles further comprises a passivation layer and/or a flat layer.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

REFERENCE NUMERALS

Figure 1:
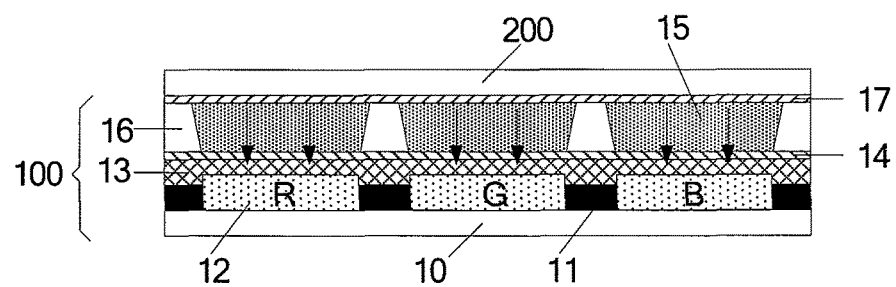
FIG. 1 is a schematic diagram of an existing organic light emitting diode light emitting display.

10 First underlay substrate
11 Black matrix film layer
12 Color film layer
13 Flat layer
14 First electrode layer
15 Organic light emitting functional layer
16 Pixel defining layer
17 Second electrode layer
100 Array substrate
101 Passivation layer
102 Thin film transistor
200 Encapsulating substrate
300 Color film substrate
301 Second underlay substrate.

DETAILED DESCRIPTION OF THE INVENTION

In the following the technical solutions in embodiments of the invention will be described clearly and completely in connection with the drawings in the embodiments of the invention. Obviously, the described embodiments are just a part of the embodiments of the invention, and not all the embodiments. Based on the embodiments in the invention, all the other embodiments obtained by those of ordinary skills in the art under the premise of not paying out creative work pertain to the scope protected by the invention.

An embodiment of the invention provides a display apparatus comprising a light emitting unit and further comprising several layers of thin film located in the light emission path of the light emitting unit, at least one of the several layers of thin film having nanoparticles.

The nanoparticles are particles with the grain diameter of 1-100 nm, which belongs to a range of the sizes of colloid particles. They are in a transition region between atom clusters and macro objects, and are a group composed of a small number of atoms or molecules, and therefore the nanoparticles have a novel physical-chemical characteristic. Since the grain diameter is very small, and the surface curvature is very large, the nanoparticles have a certain surface scattering effect. And further preferably, the grain diameter of the nanoparticles is 1.5-5 nm.

In an embodiment of the invention, the light emanated from the light emitting unit passes through several layers of thin film to exit, wherein at least one of the several layers of thin film is a thin film having nanoparticles, that is, at least one of the several layers of thin film disposed on the light emission side of the light emitting unit is a thin film having nanoparticles. Then, the phenomenon of light scattering happens when the light emanated from the light emitting unit passes the thin film, which reduces the total reflection of the light, increases the output of the light, and in turn improves the light emission efficiency of the entire display apparatus, and increases the display luminance.

Although in the embodiment of the invention, the light emanated from the light emitting unit passes through several layers of thin film to exit, it may be appreciated by the skilled in the art that, it is also feasible that the light emanated from the light emitting unit passes through a single layer of thin film. In the latter case, the single layer of thin film may have nanoparticles, thereby increasing the output of the light.

Optionally, the light emitting unit is a backlight unit or an organic light emitting diode light emitting unit. It needs to be noted that, the display apparatus may be a liquid crystal display apparatus, or also may be a self-luminous display apparatus. And when the display apparatus is a liquid crystal display apparatus, the light emitting unit is a backlight unit, and the light emanated from the backlight unit of the liquid crystal display apparatus passes a pixel unit on a substrate to exit. When the display apparatus is a self-luminous display apparatus, the light emitting unit may be an organic light emitting diode light emitting unit. In an embodiment of the invention, that the light emitting unit is a light emitting diode light emitting unit is taken as an example for a detailed description.

Optionally, the at least one layer of thin film having nanoparticles comprises a color film layer.

It needs to be noted that, when the light emitting unit emanates white light, in order to implement color display, a color film layer is generally disposed, which comprises film layers of three primary colors, red, green and blue, wherein a pixel unit comprises a red sub-pixel, a green sub-pixel and a blue sub-pixel, and color display of various colors is achieved by adjusting display gray scales of sub-pixels of different colors. Therein, optionally, the light emitting diode may be a full fluorescent light emitting diode, a full phosphorescent light emitting diode, or also may be a phosphorescence and fluorescence combined luminescent light emitting diode. Of course, for a self-luminous display, e.g., an organic light emitting diode display, a diode may emit light of different colors, and then color display may be implemented without a color film layer.

Figure 2:
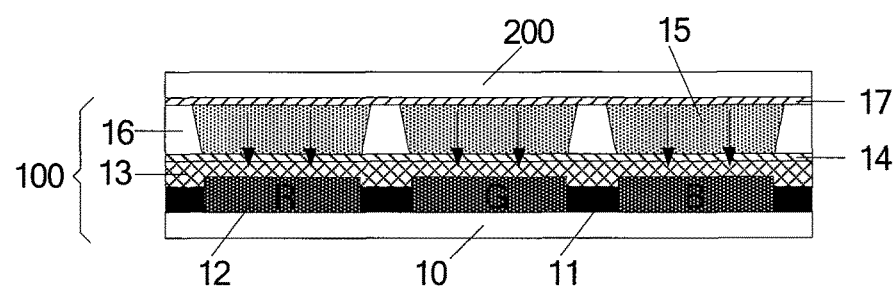
FIG. 2 is a schematic diagram of an organic light emitting diode light emitting display provided by an embodiment of the invention.

In particular, as shown in FIG. 2, nanoparticles are added into the color film layer 12, and the light emanated from the organic light emitting functional layer 15 undergoes the scattering of the nanoparticles in the color film layer 12, which increases the output of the light of the color film layer, and in turn improves the light emission efficiency of the entire display apparatus.

Optionally, the at least one layer of thin film having nanoparticles further comprises a passivation layer and/or a flat layer.

The light emanated from the light emitting unit further passes through the passivation layer and/or the flat layer to exit, and the passivation layer and/or the flat layer has nanoparticles, which may be understood as follows: the light emanated from the light emitting unit further passes through the passivation layer or the flat layer to exit, and the passivation layer or the flat layer has nanoparticles; or the light emanated from the light emitting unit further passes through the passivation layer and the flat layer to exit, and the passivation layer and the flat layer have nanoparticles.

It needs to be noted that, as shown in FIG. 2, when the light emitting unit of the display apparatus is an organic light emitting diode light emitting unit, the light emanated from the organic light emitting diode (organic light emitting functional layer 15) passes the flat layer 13 and the color film layer 12 to exit (there is no passivation layer on the substrate), and nanoparticles may be added in the flat layer 13 and the color film layer 12.

Figure 4:
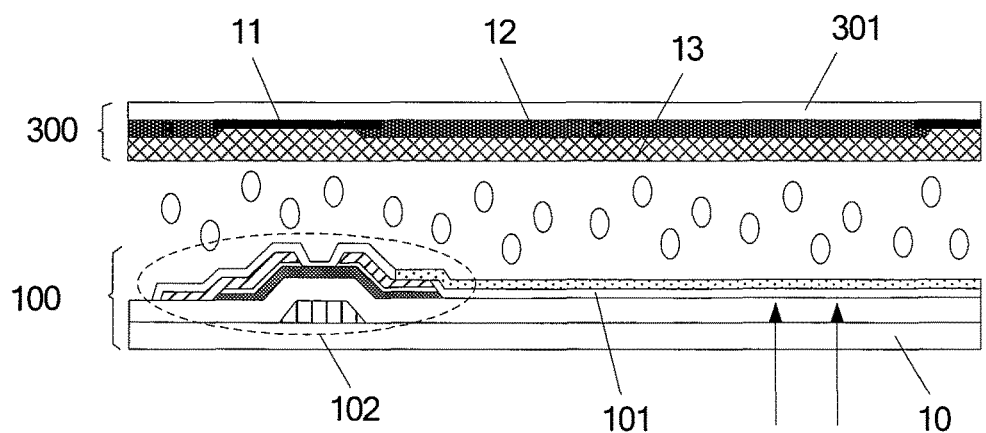
FIG. 4 is a schematic diagram of a liquid crystal display provided by an embodiment of the invention.

Of course, for a liquid crystal display, since it is a backlight light emitting unit, the thin film or layered structures on an array substrate of the liquid crystal display are many. As shown in FIG. 4, on a first underlay substrate 10 of the array substrate 100 on the light exiting side of the backlight unit are disposed a thin film transistor 102 and a passivation layer 101, and on a color film substrate 300 are disposed a black matrix 11, a color film layer 12 and a flat layer 13. The color film layer 12 and the flat layer 13 on the color film substrate 300 of the liquid crystal display may be doped with nanoparticles; and meanwhile, nanoparticles may also be doped in the passivation layer 101 of the array substrate 100, to further improve the transmittance of the light.

Optionally, the nanoparticle is one kind or several kinds of inorganic nanoparticle. That is, a kind of nanoparticle may be added in a layer of thin film, for example, only nanoparticles are added in the blue film layer. Or, also several kinds of mixed inorganic nanoparticles may be added in a layer of thin film. For example, it may also be that $SiO_2$ and $SiN_x$ mixed nanoparticles are added in the blue film layer.

Of course, the nanoparticle may further be other nanoparticle, e.g., may further be a gold nanoparticle, etc. In an embodiment of the invention, only the inorganic nanoparticle is taken as an example for a detailed description.

Optionally, the inorganic nanoparticle is produced by one or more material selected from the group of: $MgF_2$, $CaF_2$, $SiO_2$, BaF, $B_2O_3$, NaF, $AlF_3$, SiO, LiF, $Na_3AlF_6$, KF, $CdF_2$, $DyF_3$, $LaF_3$, $WO_3$, ZnSe, ZnS, $TiO_2$, $Sb_2S_3$, $ZrO_2$, BaO, BaS, $BaTiO_3$, $Bi_2O_3$, $V_2O_5$, and $SiN_x$. Of course, the inorganic nanoparticle may also be other nanoparticle with a property identical or similar to those of the above materials. In an embodiment of the invention, only the above is taken as an example for a detailed description.

Optionally, only the color film layer has nanoparticles, and the thickness of the color film layer is 1.5-3 μm. That is, only in the color film layer are there nanoparticles, and not in other thin film or layered structure are added nanoparticles.

Optionally, the color film layer comprises a red film layer, a green film layer and a blue film layer, wherein only the blue film layer has nanoparticles.

Figure 3:
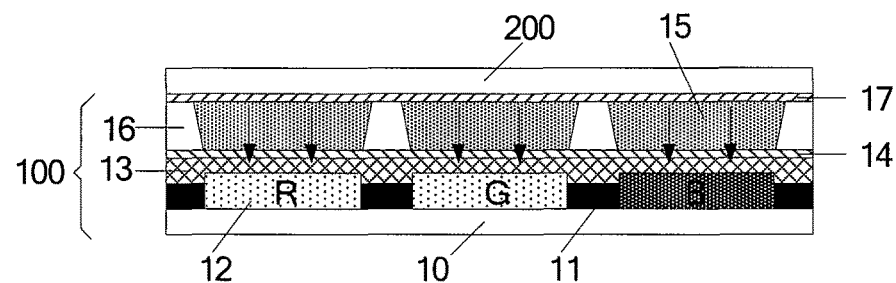
FIG. 3 is a schematic diagram of another organic light emitting diode light emitting display provided by an embodiment of the invention.
Figure 5:
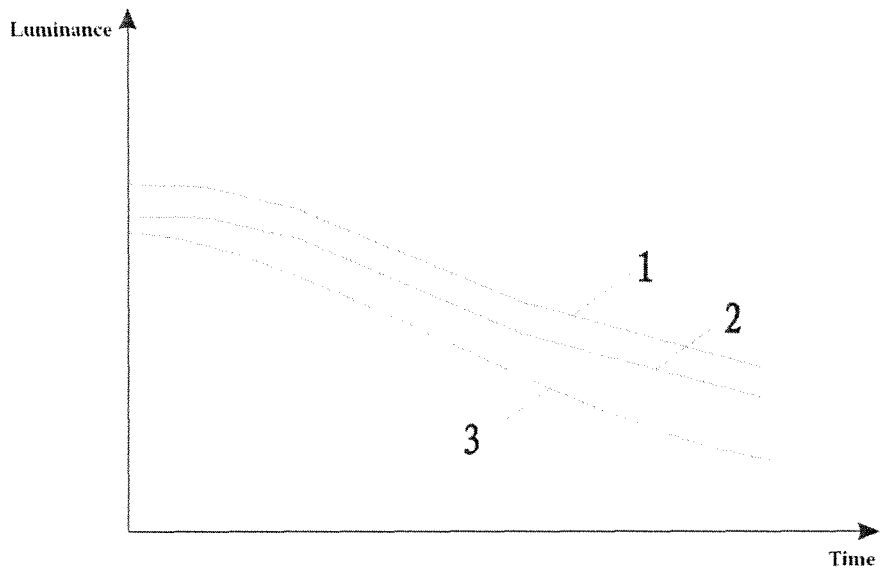
FIG. 5 is a schematic diagram of the attenuation of luminance of sub-pixels of different colors over the display time.

It needs to be noted that, in general, by means of three primary colors, red, green and blue, a display apparatus may implement multi-color display by adjusting the display gray scales of different sub-pixels, however, the display unit of an existing display apparatus may also be sub-pixels comprising other colors such as red, green, blue and white, or red, green, blue and yellow, etc. Moreover, the film layers of different colors are respectively formed by performing a patterning process once, the display apparatus comprises a sub-pixel of other color, and nanoparticles may further be added in sub-pixels of other different colors, respectively. In an embodiment of the invention, that the display unit comprises sub-pixels of three colors, red, green and blue, namely, the color film layer comprises a red film layer, a green film layer and a blue film layer is only taken as an example for a detailed description. As shown in FIG. 5, in the organic light emitting diode display, the luminance of the blue sub-pixel 3 attenuates rapidly over time, the luminance of the green sub-pixel 1 and the red sub-pixel 2 attenuates slowly over time, the color coordinates of the light emitted by the device drift, and the phenomenon of red shift occurs in the white balance, that is, the white balance shifts towards warmness during full color displaying, which severely affects the lifetime of the display. Therefore, as shown in FIG. 3, nanoparticles are added only in the blue (B) film layer, which may reduce the attenuation rate of blue, in turn cause the attenuation of the blue sub-pixel and the red sub-pixel to be close to each other, and prolong the lifetime of the display.

Optionally, the red film layer, the green film layer and the blue film layer all have nanoparticles. That is, as shown in FIG. 2, nanoparticles are added in the red (R) film layer, the green (G) film layer and the blue (B) film layer, to increase the overall display luminance of the display apparatus.

Optionally, the volume concentration of the nanoparticles in the color film layer is 1%-60%. The volume concentration, i.e., the volume percentage concentration, means the volume (in ml) of a solute per 100 ml of a solution. Further, preferably, the volume concentration of the nanoparticles in the color film layer is 5%-30%, to attain better light emitting brightness.

An embodiment of the invention provides a method for manufacturing a display apparatus, which display apparatus comprises a light emitting unit, the method comprising:

forming several layers of thin film located in the light emission path of the light emitting unit, at least one of the several layers of thin film having nanoparticles.

The at least one layer of thin film having nanoparticles is formed on the light exiting side of the light emitting unit. It needs to be noted that, if the display apparatus is a liquid crystal display apparatus, then the light emitting unit is a backlight unit, and both the array substrate and the color film substrate of the liquid crystal display apparatus are disposed on the light exiting side of the light emitting unit. If the display apparatus is self-luminous display apparatus, it may be divided into a top light emitting display apparatus and a bottom light emitting display apparatus, however, no matter which kind of display apparatus it is, the thin film having nanoparticles in the invention is on the light exiting side of the light emitting unit, that is, the light emanated from the light emitting unit passes the layer of thin film to exit, and the nanoparticles scatter the light of the backlight unit, which reduces the total reflection of the light, increases the output of the light, and in turn improves the light emission efficiency of the entire display apparatus, and increases the display luminance.

Optionally, the at least one layer of thin film having nanoparticles comprises a color film layer; and the method further comprises: forming a color film layer doped with nanoparticles on an underlay substrate.

In particular, a blue film layer may be formed by spin coating a blue resin typed photoresist material which is doped with $SiO_2$ nanoparticles and exposing, developing and curing the material, and its thickness may be 1.5-3 μm. That is, a blue film layer doped with $SiO_2$ nanoparticles is formed on the underlay substrate. Therein, the red film layer and green film layer may be a normal red film layer and a green film layer formed by not adding nanoparticles, but directly coating a red resin typed photoresist material and a green resin typed photoresist material. Namely, nanoparticles are only added in the blue film layer.

Of course, a red film layer and a green film layer which are doped with nanoparticles may also be formed by adding nanoparticles in a red resin typed photoresist material and a green resin typed photoresist material simultaneously, and spin coating the materials.

Optionally, the at least one layer of thin film having nanoparticles further comprises a passivation layer and/or a flat layer.

When the display apparatus is a self-luminous display apparatus, as shown in FIG. 2, a flat layer 13 doped with nanoparticles is formed on the underlay substrate 10 of the array substrate 100. When the display apparatus is a liquid crystal display apparatus, a passivation layer 101 doped with nanoparticles may be formed on the first underlay substrate 10 of the array substrate 100, and also a color film layer 12 and a flat layer 13 which are doped with nanoparticles may be formed on a second underlay substrate 301 of the color film substrate 300.

Figure 6:
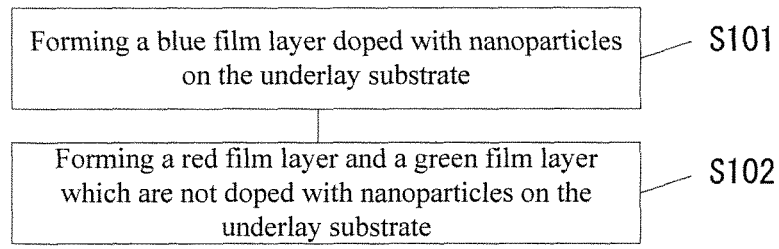
FIG. 6 is a schematic diagram of a method for forming a color film layer provided by an embodiment of the invention.
Figure 7:
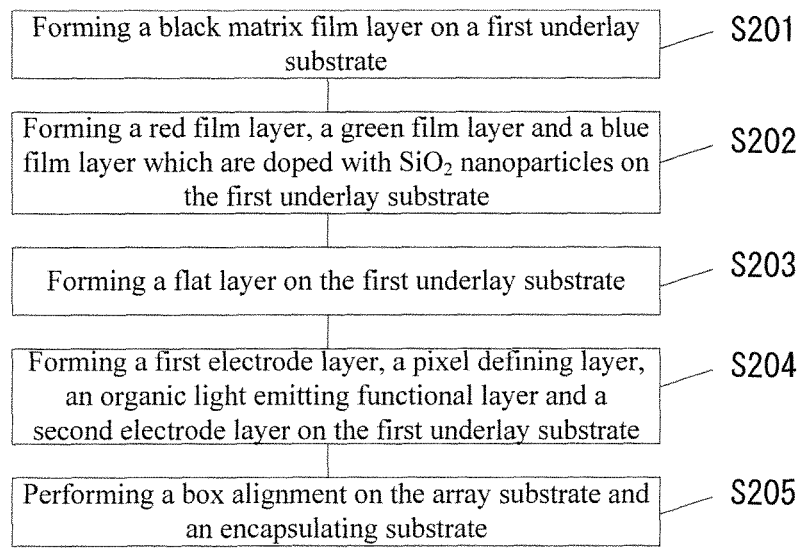
FIG. 7 is a schematic diagram of a method for manufacturing a display apparatus provided by an embodiment of the invention.

Optionally, as shown in FIG. 6, the step of forming a color film layer doped with nanoparticles on an underlay substrate comprises:

step 101: forming a blue film layer doped with nanoparticles on the underlay substrate; and step 102: forming a red film layer and a green film layer which are not doped with nanoparticles on the underlay substrate.

The formed display apparatus is as shown in FIG. 3, the blue (B) film layer in the color film layer 12 is doped with nanoparticles, and the red (R) film layer and the green (G) film layer are not doped with nanoparticles. In particular, in the organic light emitting diode display, the luminance of the blue sub-pixel attenuates rapidly over time, the luminance of the green sub-pixel and the red sub-pixel attenuates slowly over time, and the color coordinates of the light emitted by the device drift, and the phenomenon of red shift occurs in the white balance, that is, the white balance shifts towards warmness during full color displaying, which severely affects the lifetime of the display. Therefore, as shown in FIG. 3, nanoparticles are added only in the blue (B) film layer, which may reduce the attenuation rate of blue, in turn cause the attenuation of the blue sub-pixel and the red sub-pixel to be close to each other, and prolong the lifetime of the display.

It needs to be noted that, the manufacture order for forming color film layers of different colors may be variable. Since each color film layer is formed by exposure once, color film layers of different colors may be formed as needed.

Optionally, the step of forming a color film layer doped with nanoparticles on an underlay substrate comprises:

forming a red film layer, a green film layer and a blue film layer which are doped with nanoparticles on the underlay substrate.

That is, the formed display apparatus is as shown in FIG. 2, the blue (B) film layer, the red (R) film layer and the green (G) film layer in the color film layer 12 are all doped with nanoparticles, to increase the overall display luminance of the display apparatus.

In the following, a specific embodiment is provided for illustrating a manufacturing method for forming a display apparatus as shown in FIG. 2, and as shown in the figure, the method comprises the following steps.

At step 201, a black matrix film layer is formed on a first underlay substrate.

In particular, after the first underlay substrate is formed, a layer of thin film is formed on the first underlay substrate by spin coating a resin typed material, and a black matrix is formed by exposing, developing and curing the thin film.

At step 202, a red film layer, a green film layer and a blue film layer which are doped with $SiO_2$ nanoparticles are formed on the first underlay substrate.

In particular, a red film layer is formed by spin coating a red resin typed material doped with $SiO_2$ nanoparticles on the underlay substrate and exposing, developing and curing the material, and the thickness of the formed red film layer is 1.5-3 μm; and the grain diameter of the $SiO_2$ nanoparticles is between 1-10 nm, and the volume concentration of the $SiO_2$ nanoparticles in the red film layer is 30%. Then, a green film layer and a blue film layer are formed in turn according to the above process.

At step 203, a flat layer is formed on the first underlay substrate.

In particular, a flat layer may be formed by spin coating an acrylic-based material and curing it, and the thickness of the flat layer is about 4 μm.

At step 204, a first electrode layer, a pixel defining layer, an organic light emitting functional layer and a second electrode layer are formed on the first underlay substrate.

In particular, the method for manufacturing a first electrode layer, a pixel defining layer, an organic light emitting functional layer and a second electrode layer may be referred to the prior art, and will not be repeated here. Therein, the pixel defining layer may be formed by spin coating an acrylic-based material and exposing, developing and curing it, and the thickness of the pixel defining layer is about 1.5 μm.

After the above steps 201-204, individual layers of thin film or layered structures are formed on the first underlay substrate, and an array substrate 100 as shown in FIG. 2 is formed.

At step 205, the array substrate and an encapsulating substrate are box aligned.

The display apparatus formed after box alignment is as shown in FIG. 2, wherein nanoparticles are doped in the color film layer.

It needs to be noted that, forming a display apparatus as shown in FIG. 2 is not only limited to the above steps, but the corresponding manufacture order may also be regulated correspondingly as needed. For example, order of step 201 and step 202 may also be exchanged. In the embodiment of the invention, only the above is taken as an example for a detailed description.

The above description is just specific embodiments of the invention, however, the protection scope of the invention is not limited thereto, and variations or alternatives easily occurring to any artisan familiar with the technical field within the technical scope disclosed by the invention should be encompassed within the protection scope of the invention. Therefore, the protection scope of the invention should be subject to the protection scope of the claims.

The invention claimed is:

1. A display apparatus comprising a light emitting unit and several layers of thin film located in a light emission path of the light emitting unit; wherein at least one of the several layers of thin film has nanoparticles, the at least one layer of thin film having nanoparticles comprises a color film layer; and wherein the color film layer comprises a red film layer, a green film layer and a blue film layer, and only the blue film layer has nanoparticles.

2. The display apparatus as claimed in claim 1, wherein the at least one layer of thin film having nanoparticles further comprises a passivation layer and/or a flat layer.

3. The display apparatus as claimed in claim 1, wherein the nanoparticle is one kind or several kinds of inorganic nanoparticle.

4. The display apparatus as claimed in claim 2, wherein the nanoparticle is one kind or several kinds of inorganic nanoparticle.

5. The display apparatus as claimed in claim 3, wherein the inorganic nanoparticle is produced by one or more material selected from the group of: $MgF_2$, $CaF_2$, $SiO_2$, $BaF$, $B_2O_3$, $NaF$, $AlF_3$, $SiO$, $LiF$, $Na_3AlF_6$, $KF$, $CdF_2$, $DyF_3$, $LaF_3$, $WO_3$, $ZnSe$, $ZnS$, $TiO_2$, $Sb_2S_3$, $ZrO_2$, $BaO$, $BaS$, $BaTiO_3$, $Bi_2O_3$, $V_2O_5$, and $SiN_x$.

6. The display apparatus as claimed in claim 4, wherein the inorganic nanoparticle is produced by one or more material selected from the group of: $MgF_2$, $CaF_2$, $SiO_2$, $BaF$, $B_2O_3$, $NaF$, $AlF_3$, $SiO$, $LiF$, $Na_3AlF_6$, $KF$, $CdF_2$, $DyF_3$, $LaF_3$, $WO_3$, $ZnSe$, $ZnS$, $TiO_2$, $Sb_2S_3$, $ZrO_2$, $BaO$, $BaS$, $BaTiO_3$, $Bi_2O_3$, $V_2O_5$, and $SiN_x$.

7. The display apparatus as claimed in claim 1, wherein the thickness of the color film layer is 1.5-3 μm.

8. The display apparatus as claimed in claim 1, wherein the volume concentration of the nanoparticles in the blue film layer is 1%-60%.

9. The display apparatus as claimed in claim 8, wherein the volume concentration of the nanoparticles in the blue film layer is 5%-30%.

10. The display apparatus as claimed in claim 1, wherein the grain diameter of the nanoparticle is 1.5-5 nm.

11. The display apparatus as claimed in claim 1, wherein the light emitting unit is a backlight unit or an organic light emitting diode light emitting unit.

12. A method for manufacturing a display apparatus comprising a light emitting unit, wherein the method comprises:
forming several layers of thin film located in a light emission path of the light emitting unit;
wherein at least one of the several layers of thin film has nanoparticles, the at least one layer of thin film having nanoparticles comprises a color film layer; and wherein the color film layer comprises a red film layer, a green film layer and a blue film layer, only the blue film layer has nanoparticles.

13. The manufacturing method as claimed in claim 12, wherein the at least one layer of thin film having nanoparticles further comprises a passivation layer and/or a flat layer.

* * * * *